United States Patent [19]

Ishikawa et al.

[11] Patent Number: 5,126,683

[45] Date of Patent: Jun. 30, 1992

[54] DETECTION CIRCUIT FOR AMPLITUDE MODULATED SIGNALS

[75] Inventors: Katsuya Ishikawa, Kawasaki; Yasuhiro Hashimoto, Yokohama; Chikara Tsuchiya, Machida, all of Japan

[73] Assignee: Fujitsu Limited, Kawasaki, Japan

[21] Appl. No.: 587,685

[22] Filed: Sep. 25, 1990

[30] Foreign Application Priority Data

Sep. 25, 1989 [JP] Japan .................. 1-248860

[51] Int. Cl.⁵ .............................. H03D 1/00
[52] U.S. Cl. ..................... 329/369; 307/350
[58] Field of Search .......... 329/347, 349, 351, 353, 329/363, 369; 307/350, 530, 542, 552; 358/23

[56] References Cited

U.S. PATENT DOCUMENTS 4,250,457  2/1981  Hofmann ................. 307/350 X
4,492,926  1/1985  Kusakabe et al. ......... 329/369 X

FOREIGN PATENT DOCUMENTS 028454  5/1981  European Pat. Off. .
0052605  4/1980  Japan ......................... 329/369
0628603  8/1978  U.S.S.R. ...................... 329/369

OTHER PUBLICATIONS

Patent Abstracts of Japan, vol. 2, No. 56 (E-78) [1385], 24th Apr. 1978 & JP-A-53 020 760 (MATSUSHITA) 25-02-1978.
Patent Abstracts of Japan, vol. 1, No. 98 (E-77) [2864], 31st Aug. 1977; & JP-A-52 031 644 (HITACHI SEISAKUSHO K.K.) 03-10-1977.
Proceedings of the IEEE, vol. 67, No. 4, Apr. 1979, pages 687-689, New York, US; S. Pookaiyaudom et al.: "A Single-Transistor full-wave rectifier".

Primary Examiner—Robert J. Pascal
Attorney, Agent, or Firm—Staas & Halsey

[57] ABSTRACT

A detection circuit of amplitude modulated signals comprises a first bipolar transistor having a base connected to an input terminal, a collector connected to a first voltage source providing a first power voltage and an emitter; a second bipolar transistor having a base, a collector connected to the first voltage source, and an emitter which is coupled commonly to the emitter of the first bipolar transistor; an output terminal connected commonly to the emitter of the first bipolar transistor and the emitter of the second bipolar transistor for providing an output signal; a biasing circuit connected to the base of the first bipolar transistor and to the base of the second bipolar transistor for biasing the first and second bipolar transistor; a control circuit having an input terminal connected to the base of the first bipolar transistor for producing a control signal in response to an amplitude modulated signal supplied to the input terminal; and a variable current source having a first end connected to the emitters of the first and second bipolar transistors, and a second end connected to a second voltage source providing a second power voltage which is different from the first power voltage, for causing to flow therethrough a drive current to the second voltage source, wherein the control circuit contols the variable current source by the control signal such that the output signal at the output terminal has a voltage level which increases linearly with increasing amplitude of the input amplitude modulated signal in one of positive and negative half cycles of the amplitude modulated signal and such that the output signal has a constant voltage level in the other of the positive and negative half cycles of the amplitude modulated signal.

8 Claims, 4 Drawing Sheets

PRIOR ART

DETECTION CIRCUIT FOR AMPLITUDE MODULATED SIGNALS

BACKGROUND OF THE INVENTION

The present invention generally relates to detection circuits and more particularly to a detection circuit for detecting amplitude modulated signals.

Detection circuits for detecting amplitude modulated signals are used in various electronic devices. In the simplest case, the detection circuit comprises a single diode. In the case of the detection of video signals and the like, a detection circuit that provides a particularly stable detection characteristic is required.

FIG. 1 shows a conventional detection circuit used in video signal processing apparatus for detecting video signals.

Referring to FIG. 1, a pair of npn transistors $Q_1$ and $Q_2$ are provided to form a differential amplifier. More specifically, the transistor $Q_1$ has a collector connected to a voltage source $V_{CC}$, an emitter connected to the ground via a constant current source I, and a base connected to an input terminal 10 25 via a coupling capacitor C1. The transistor $Q_2$ has a collector connected commonly with the collector of the transistor $Q_1$ to the voltage source $V_{CC}$, an emitter connected, commonly with the emitter of the transistor $Q_1$ to the ground via the constant current source I. Further, the base of the transistor $Q_1$ is biased by a reference voltage source $V_{REF}$ via a resistor $R_1$. Similarly, the transistor $Q_2$ has a base biased by the same reference voltage source $V_{REF}$ via a resistor $R_2$. The output of the detection circuit is obtained at an output terminal 11 which is connected to the emitter of the transistor $Q_1$.

In operation, the transistors $Q_1$ and $Q_2$ are biased to produce a constant output at the output terminal 11 as long as the input signal at the input terminal 10 is below a predetermined bias voltage level. When there is an amplitude modulated radio frequency signal coming in at the input terminal 10, the voltage level at the base of the transistor $Q_1$ is changed positively and negatively about the bias voltage level. Thereby, only the positive half cycle of the radio frequency signal is passed through the transistor $Q_1$ from the base to the emitter after rectification at a p-n junction formed between the base and the emitter of the transistor $Q_1$, and supplied to the output terminal 11. In the case that the radio frequency signal is in the negative half cycle, the output at the output terminal 11 remains stationary because of the rectifying action of the p-n junction.

FIG. 2 shows the operational characteristic of the detection circuit of FIG. 1 which shows the input versus output characteristic for the input signal $V_{in}$ in the vicinity of the bias voltage represented by $V_B$.

Referring to FIG. 1, the output of the detection circuit increases generally linearly when the voltage level in the input signal exceeds the predetermined bias voltage to the transistor $Q_1$ while it remains substantially stationary when the voltage level in the input signal is below the predetermined bias voltage. Thereby, the input signal at the input terminal 10 is rectified and the detection of the amplitude modulated signal is achieved.

In such a circuit, however, there is a problem in that the actual characteristic illustrated in FIG. 2 by a broken line is deviated from the ideal characteristic which is illustrated by a solid line. It should be noted that the ideal characteristic has a sharp deflection at the origin corresponding to the bias voltage $V_B$ and the output voltage at the output terminal 11 increases linearly with increasing voltage level at the input terminal 10. In the actual case, however, there is no such a sharp deflection in the characteristic but the characteristic is curved as illustrated schematically. This deviation is caused by the well known rectifying characteristic of the p-n junction formed between the base and the emitter of the transistor $Q_1$.

When there is such a deviation, the output signal obtained at the output terminal 11 is inevitably distorted because of the non-linearity in the characteristic curve. Further, a small, negative output appears even when the input amplitude modulated signal is in the negative half cycle. It should be noted that such negative output should not appear in the rectified signal at the output terminal 11. Because the non-linearity in the rectifying characteristic is limited in the vicinity of the voltage $V_B$ at the base of the transistor $Q_1$, it should be noted that such a distortion appears particularly conspicuous when the amplitude of the input signal $V_{in}$ at the input terminal 10 is small.

In order to avoid the problem of distortion of the output signal of the detection circuit, an amplifier circuit is usually provided before the detection circuit for amplifying the input radio frequency signal so that the effect of the distortion is minimized. However, such a measure is not desirable, as such an amplification at the earlier stages in the processing of signals may cause an unwanted saturation in the later stages. Thereby, an unwanted distortion is inevitably introduced.

It is much more desirable to detect the radio frequency signals prior to the amplification so that the problem of distortion caused by the amplification in the later stages is avoided. For this purpose, the distortion caused in the radio frequency signals of the minute amplitude due to the deviation in the detection characteristic as explained has to be eliminated.

SUMMARY OF THE INVENTION

Accordingly, it is a general object of the present invention to provide a novel and useful detection circuit for detecting amplitude modulated signals, wherein the aforementioned problems are eliminated.

Another and more specific object of the present invention is to provide a detection circuit of amplitude modulated signals, wherein deviation from the ideal characteristic is eliminated.

Another object of the present invention is to provide a detection circuit of amplitude modulated signals wherein an output signal produced in response to one of first and second half cycles of the input amplitude modulated signal increases the magnitude linearly with increasing amplitude of the input amplitude modulated signal while remains substantially zero in response to the other of the first and second half cycles.

Another object of the present invention is to provide a detection circuit of amplitude modulated signals, comprising: an input terminal to which an amplitude modulated signal is supplied; a first bipolar transistor having a base connected to the input terminal, a collector connected to a first voltage source providing a first power voltage and an emitter; a second bipolar transistor having a base, a collector connected to the first voltage source and an emitter which is coupled commonly to the emitter of the first bipolar transistor; an output terminal connected commonly to the emitter of the first bipolar transistor and the emitter of the second bipolar transistor; biasing means connected to the base of the first bipolar transistor and to the base of the second bipolar transistor for biasing the first and second bipolar transistor such that a predetermined, stationary output is obtained at the emitter of the first bipolar transistor; control means having an input terminal connected to the base of the first bipolar transistor for producing a control signal in response to the amplitude modulated signal supplied to the base of the first bipolar transistor; and variable current source means having a first end connected to the emitters of the first and second bipolar transistors, and a second end connected to a second voltage source providing a second power voltage which is different from the first power voltage, for causing to flow therethrough a current to the second voltage source, said current being a sum of an emitter current flowed through the first bipolar transistor and an emitter current flowed through the second bipolar transistor, said variable current source means having an input terminal connected to the control means for receiving therefrom the control signal and controlling the current flowing therethrough in response to the control signal; wherein said control means controls the variable current source by the control signal such that the current changes generally linearly with the amplitude modulated signal at the input terminal in a predetermined range of amplitude and such that the current remains constant irrespective of the amplitude of the amplitude modulated signal in an amplitude range beyond the predetermined range.

According to the present invention, the deviation in the detection characteristic from the ideal characteristic for the small amplitude input signal is effectively compensated by changing the current flowing through the variable current source means in correspondence to the small amplitude of the input signal. On the other hand, when the input amplitude modulated signal has a moderate or large amplitude, the variable current source provides a constant current. As a result, there appears an output voltage on the output terminal such that, during one of first and second half cycles of the amplitude modulated signal at the input terminal, the output voltage increases linearly with increasing amplitude of the amplitude modulated signal from the zero amplitude to a large amplitude, while in the other of the first and second half cycles, the output voltage remains substantially constant irrespective of the amplitude of the input amplitude modulated signal.

Other objects and further features of the present invention will become apparent from the following detailed description when read in conjunction with the attached drawings.

DETAILED DESCRIPTION

Figure 2:
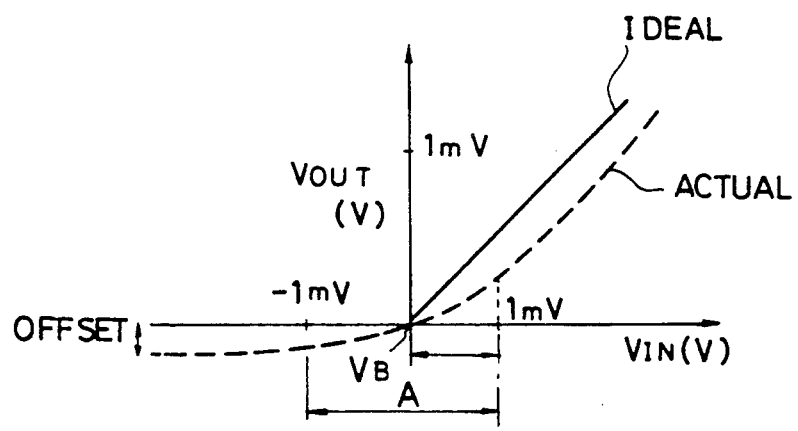
FIG. 2 is a graph for explaining the problem pertinent to the conventional circuit of FIG. 1.
Figure 3:
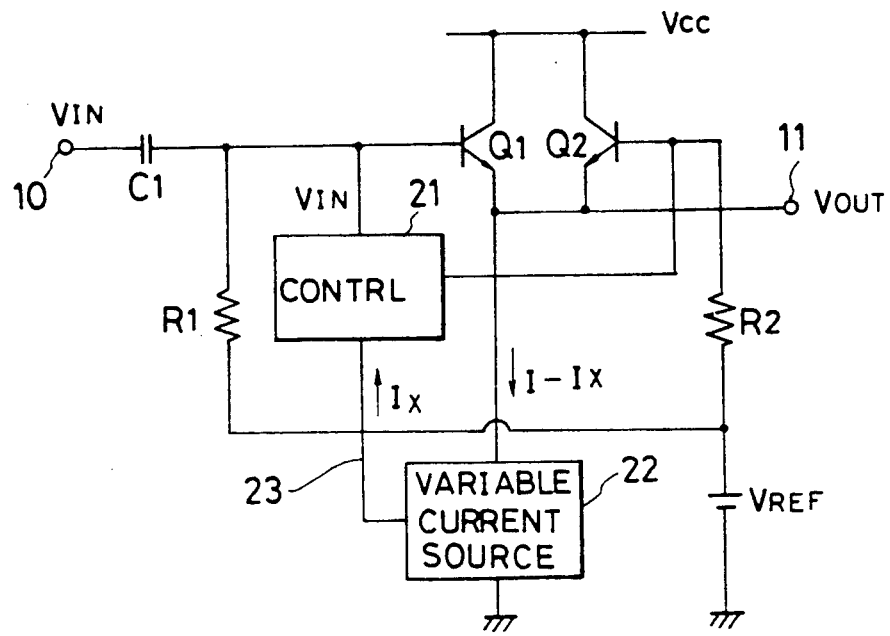
FIG. 3 is a circuit diagram for explaining the principle of the present invention.

FIG. 3 explains the principle of the present invention. In FIG. 3, the parts that are constructed identically to those in FIG. 2 are given identical reference numerals and the description thereof will be omitted.

Figure 1:
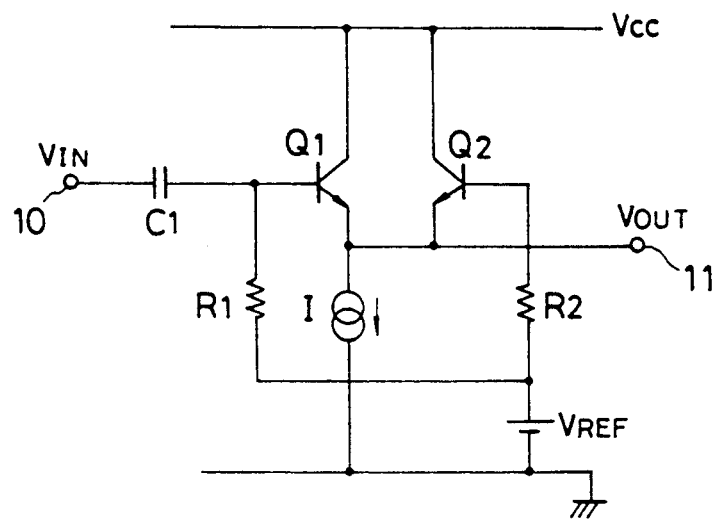
FIG. 1 is a circuit diagram showing a conventional detection circuit used for detecting amplitude modulated signals.

In the circuit of FIG. 3, the constant current source I of FIG. 1 is replaced by a variable current source 22 which changes the current flowing therethrough in accordance with a control signal supplied thereto. In other words, the total emitter current, which is the sum of the emitter current through the transistor $Q_1$ and the emitter current through the transistor $Q_2$ is changed.

In order to control the variable current source 22, there is provided a control unit 21 for detecting a difference in the voltage at the base of the transistor $Q_1$ and the voltage at the base of the transistor $Q_2$. The control unit 21 produces, in response to the detected voltage difference, a control signal supplied to the variable current source 22, and the variable current source 22 is controlled in response to the control signal.

In the illustrated circuit, the control unit 21 provides the control signal as a control current $I_x$, and the variable current source 22 changes the current according to a relation $I - I_x$, wherein I stands for the current which is set at a constant level. It should be noted that the current I corresponds to the current that the constant current source I of FIG. 1 provides. With increasing current $I_x$, the current flowing through the variable current source 22 is decreased, and accordingly, the voltage level at the emitters of the transistor $Q_1$ and $Q_2$, which is detected at the output terminal 11, is modified.

Figure 4:
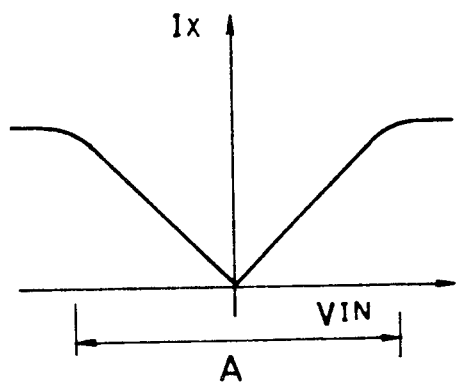
FIG. 4 is a circuit diagram for explaining the operation of the circuit of FIG. 3.

FIG. 4 shows the characteristic of the control unit 21 for controlling the variable current source 22.

Referring to FIG. 4, the control unit 21 changes the current $I_x$, which is deprived of from the variable current source 22, such that the current $I_x$ increases with increasing amplitude of the input signal $V_{in}$ at the input terminal 10 in both the positive and negative directions. It should be noted that the aforesaid change in the current $I_x$ occurs in a range A of the input voltage $V_{in}$, and this range A corresponds to the range A shown in FIG. 1 wherein the non-linearity in the detection characteristic as well as the offset appear remarkably. Beyond the range A in FIG. 4, the current $I_x$ is held constant.

In response to the current $I_x$, the variable current source 22 changes the current according to $I - I_x$ as already described. Thereby, there occurs a decrease in the current passing through the transistors $Q_1$ and $Q_2$, and associated therewith, there appears an increase in the voltage at the output terminal 11. Thereby, the characteristic curve shown in FIG. 2 by the broken line is shifted upwards in corresponding to the region A. By suitably choosing the characteristic of FIG. 4, one can cancel the deviation from the ideal characteristic shown in FIG. 2. It should be noted that the deviation is caused mainly in the region A of the input signal $V_{in}$.

Next, a first embodiment of the present invention will be described with reference to FIG. 5.

Figure 5:
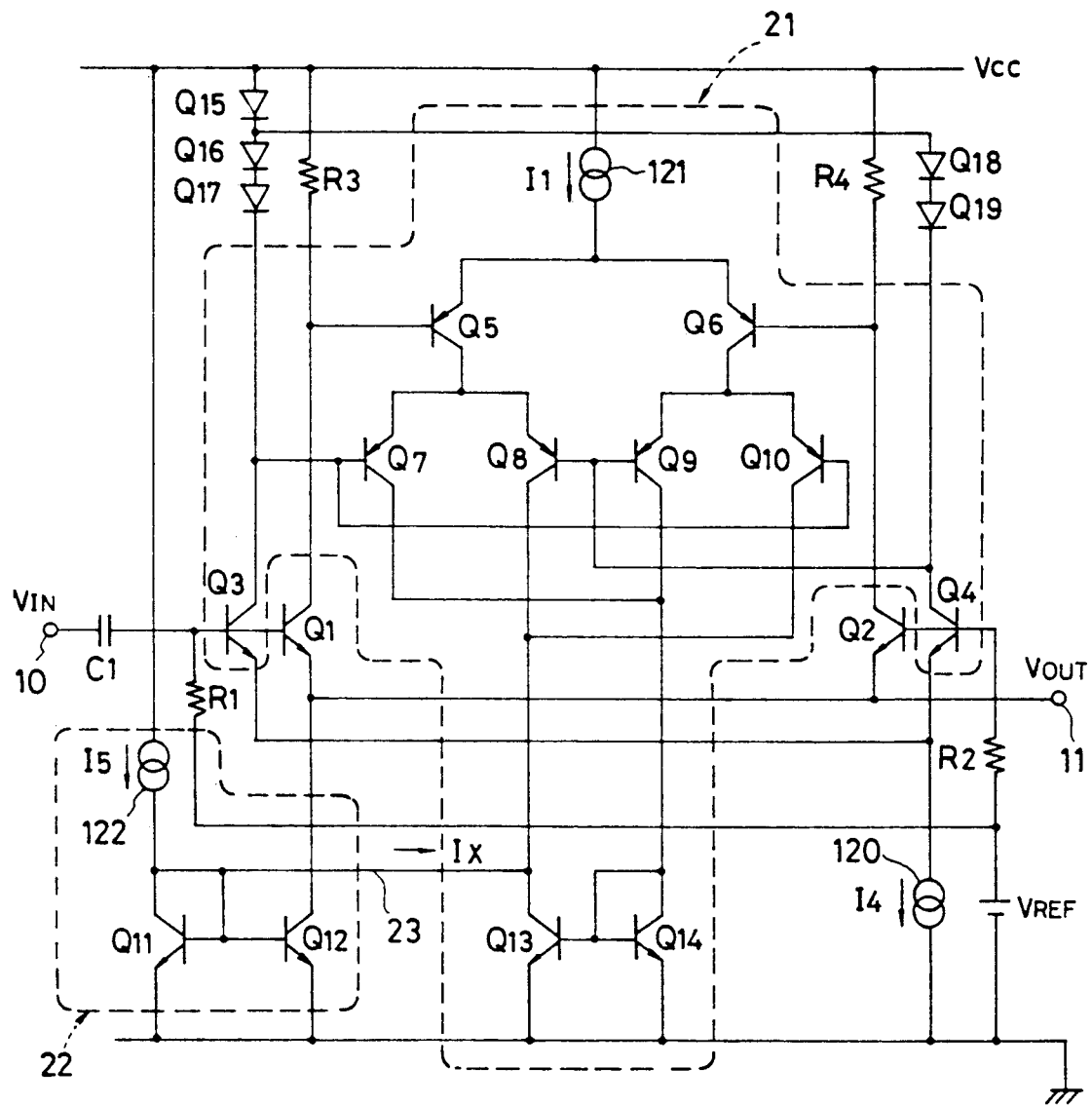
FIG. 5 is a circuit diagram showing a first embodiment of the present invention.

Referring to FIG. 5, the transistors $Q_1$ and $Q_2$ are connected similarly to the case of the circuit of FIG. 3, and the description thereof, including the input terminal 10, the coupling capacitor C1, the bias resistances R1 and R2, the reference voltage source $V_{REF}$, and the output terminal 11, will be omitted.

In the circuit of FIG. 5, there is provided an npn transistor $Q_3$ such that the transistor $Q_3$ has a base connected commonly to the base of the transistor $Q_1$. Similarly, there is provided an npn transistor Q4 such that the transistor Q4 has a base connected commonly to the base of the transistor $Q_2$. The transistors $Q_3$ and $Q_4$ have respective emitters connected commonly to the ground via a constant current source 120 that provides a constant current of 60 μA, for example. Further, the transistor $Q_3$ has a collector connected to the voltage source $V_{CC}$ via a level shift diode $Q_{15}$ and a number of level shift diodes $Q_{16}$, $Q_{17}$, ..., for providing a voltage which is n times as large as the voltage $V_{in}$, to respective bases of pnp transistors $Q_7$ and $Q_{10}$ to be described. Here, the number n corresponds to the number of stages of the level shift diodes. The transistor $Q_4$ has a collector connected to the voltage source $V_{CC}$ via the foregoing level shift diode $Q_{15}$ and further via a number of level shift diodes $Q_{18}$, $Q_{19}$ for providing a voltage which is n times as large as a voltage $-V_{in}$, to respective bases of pnp transistors $Q_8$ and $Q_9$.

The transistors $Q_7$ and $Q_8$ have respective emitters connected commonly with each other, and these emitters are connected to a collector of a pnp transistor $Q_5$. The transistors $Q_9$ and $Q_{10}$, similarly, have respective emitters connected commonly with each other, and these emitters are connected to a collector of a pnp transistor $Q_6$.

The transistors $Q_5$ and $Q_6$ have respective emitters connected commonly with each other, and these emitters are connected to the voltage source $V_{CC}$ via a constant current source 121 that provides a constant current $I$, which may be 30 μA, for example. Further, the transistors $Q_5$ and $Q_6$ have respective bases such that the base of the transistor $Q_5$ is connected to the collector of the transistor $Q_1$ and the base of the transistor $Q_6$ is connected to the collector of the transistor $Q_2$. It should be noted that the collector of the transistor $Q_1$ is connected, in this embodiment, to the voltage source $V_{CC}$ via a resistor $R_3$ and the collector of the transistor $Q_2$ is connected to the voltage source $V_{CC}$ via a resistor $R_4$.

Further, the transistors $Q_7$ and $Q_9$ have respective collectors connected commonly with each other, and these collectors are connected to a collector of a transistor $Q_{14}$ that is an npn transistor having a base connected to its collector. Similarly, the transistors $Q_8$ and $Q_{10}$ have respective collectors connected commonly with each other to a collector of an npn transistor $Q_{13}$. The transistor $Q_{13}$ has a base connected to the base of the transistor $Q_{14}$, and both the transistor $Q_{13}$ and the transistor $Q_{14}$ have respective emitters connected to the ground. Thereby, there is formed a current mirror circuit by the transistor $Q_{13}$ and the transistor $Q_{14}$.

To the emitter of the transistor $Q_1$, there is provided an npn transistor $Q_{12}$ acting as the variable current source. The transistor $Q_{12}$ has a collector connected to the emitter of the transistor $Q_1$ and an emitter connected to the ground. Further, the transistor $Q_{12}$ has a base connected to a base of an npn transistor $Q_{11}$. The transistor $Q_{11}$ has a collector connected to the voltage source $V_{CC}$ via a current source 122 and an emitter connected to the ground. Further, the base of the transistor $Q_{11}$ is connected to its collector. It should be noted that the base of the transistor $Q_{12}$ is connected to the collector of the transistor $Q_{13}$ via a line 23 which corresponds to the line 23 shown in FIG. 3.

In the foregoing construction, it should be noted that the control unit 21 is constructed from the transistors $Q_3$–$Q_{11}$, $Q_{13}$ and $Q_{14}$, and includes therein diodes $Q_{15}$–$Q_{19}$ and constant current sources 120–122. On the other hand, the variable current source 22 is formed from the transistor $Q_{12}$ as already described.

Next, the operation of the circuit of FIG. 5 will be examined.

In response to an increase in the input voltage $V_{in}$ at the input terminal 10 in correspondence to the incoming of an amplitude modulated signal, the collector current of the transistor $Q_1$ and the collector current of the transistor $Q_3$ are increased. For example, there appears an increase in the collector current of about 2% in the transistors $Q_1$ and $Q_3$ in response to the increase of the voltage $V_{in}$ by about 1 mV.

In response to this, the collector current flowing through the transistor $Q_2$ and the collector current flowing through the transistor $Q_4$ are decreased by about 2%. Thereby, the voltage drop caused across the resistor $R_3$ is increased by about 2%, while the voltage drop caused across the resistor $R_4$ is decreased by about 2%, and the current supplied from the constant current source 121 is caused to flow mainly through the transistor $Q_5$. Further, such an increase in the collector current in the transistor $Q_3$ induces an increase in the collector current of the transistor $Q_7$ by about 4% and a decrease in the collector current of the transistor $Q_8$ by about 4%.

Under such circumstances, the collector current flowing through the transistor $Q_{14}$ is increased with respect to the collector current flowing through the transistor $Q_{13}$ by about 1.2 μA. The current corresponding to this difference has to be supplied from the current source 122 as the control current $I_x$. When the control current $I_x$ is diverted from the current $I_s$ that is provided by the constant current source 122, there naturally occurs a decrease in the collector currents flowing through the transistor $Q_{11}$ and the transistor $Q_{12}$. In the foregoing case, the collector current is decreased by about 1.2 μA. In correspondence to this, the voltage drop caused by the emitter resistance of the transistor $Q_1$ is decreased by about 1 mV, and the base-emitter volta $V_{BE1}$ of the transistor $Q_1$ is held constant irrespective of the increase in the input voltage $V_{in}$.

The output voltage $V_{out}$ at the output terminal 11 is represented as $$V_{out} = V_{in} - V_{BE1}.$$

Thus, the output voltage $V_{out}$ at the output terminal 11 is proportional to the input voltage $V_{in}$ and an excellent linearity is guaranteed even when the input amplitude modulated signal has a small amplitude.

Next, the case is considered where the voltage level $V_{in}$ at the input terminal 10 is changed negatively by 1 mV from the bias voltage $V_B$.

When this occurs, the collector current of the transistor $Q_1$ and the collector current of the transistor $Q_3$ are decreased by about 2% while the collector current of the transistor $Q_2$ and the collector current of the transistor $Q_4$ are increased by about 2%. In response to this, the voltage drop across the resistor $R_3$ is decreased by about 2% while the voltage drop across the resistor $R_4$ is increased by about 2%. Thereby, the current from the constant current source 121 is caused to flow mainly through the transistor $Q_6$.

Further, the increase in the collector current of the transistor $Q_4$ causes an increase in the collector current of the transistor $Q_{10}$ by about 4% as well as a decrease in the collector current of the transistor $Q_9$ by about 4%. With this, the collector current of the transistor $Q_{14}$ is set to be smaller than the collector current of the transistor $Q_{13}$ by about 1.2 μA. Now, this difference in the collector currents causes the control current $I_x$ to flow through the transistor $Q_{11}$, together with the current $I$, from the constant current source 122. In response to this, the collector current flowing through the transistor $Q_{11}$ and the collector current flowing through the transistor $Q_{12}$ are increased by about 1.2 μA, and the voltage drop caused by the emitter resistance of the transistor $Q_1$ is increased by about 1.0 mv. As a result, the base-emitter voltage of the transistor $Q_1$ is held constant even when there is a decrease in the input voltage $V_{in}$ from the bias voltage $V_B$. In other words, the offset shown in FIG. 2 is eliminated.

Figure 6:
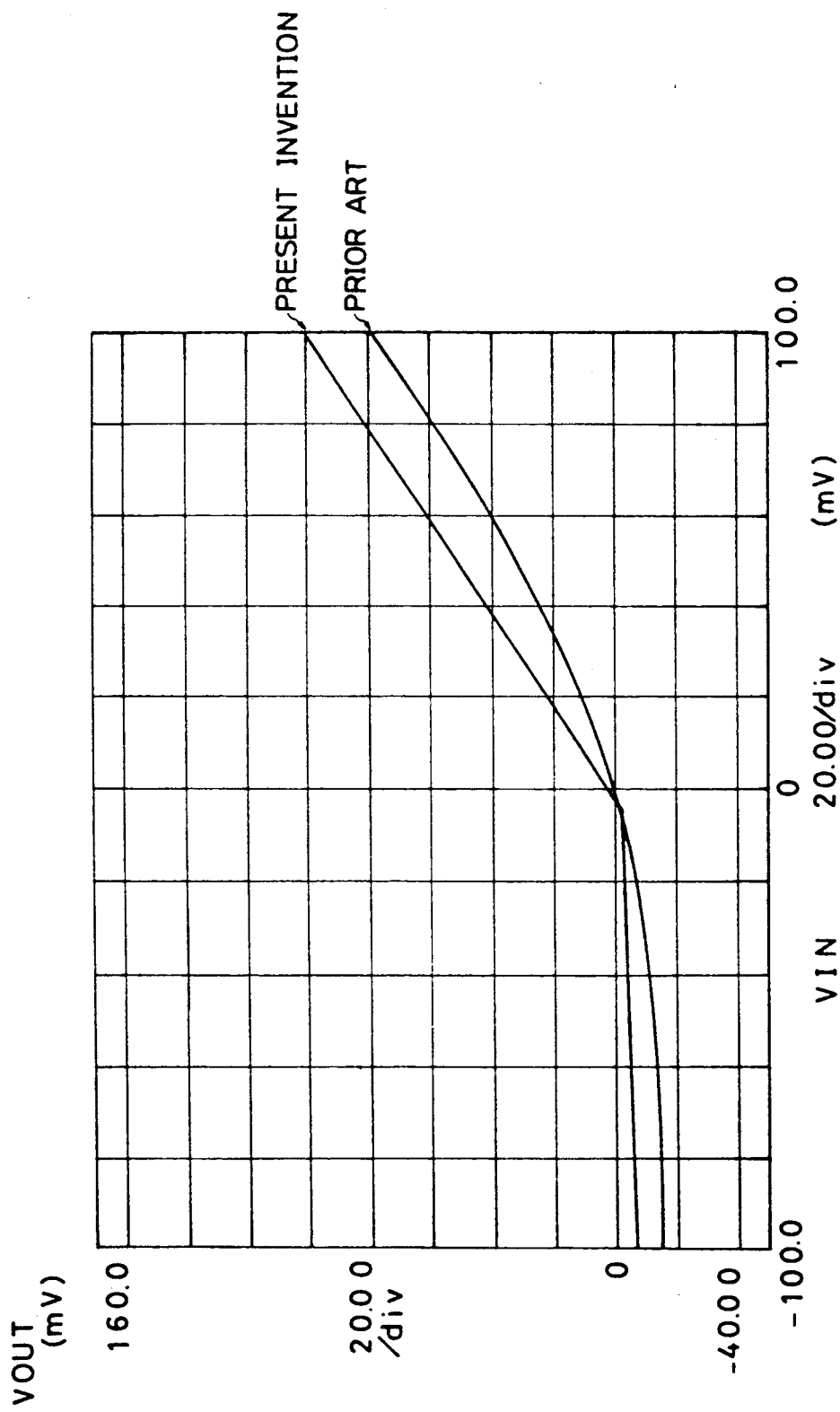
FIG. 6 is a graph showing the operational characteristic of the circuit of FIG. 5.

FIG. 6 shows an example of the compensation of the detection circuit achieved by the circuit of FIG. 5. It will be seen from this drawing that the deviation from the ideal characteristic is substantially eliminated by suitably adjusting the parameters. On the other hand, when the setting of the parameters is inappropriate, there will be a case in which the deviation becomes even larger. The appropriate setting of the parameters can be found easily by performing the simulation of the circuit.

Further, it should be noted that the control of the current $I_x$ for the compensation of deviation of the detection characteristic is not limited to the analog circuit as disclosed in FIG. 5, but may be performed by digital means. In other words, the control unit 21 may be a digital processor that changes the current $I_x$ in response to the base voltage of the transistors $Q_1$ and $Q_2$ according to a predetermined program.

Further, the present invention is not limited to the embodiments described heretofore, but various variations and modifications may be made without departing from the scope of the invention.

What is claimed is:

1. A detection circuit of amplitude modulated signals, comprising:
    an input terminal to which an amplitude modulated signal is supplied;
    a first bipolar transistor having a base connected to the input terminal, a collector connected to a first voltage source providing a first power voltage, and an emitter;
    a second bipolar transistor having a base, a collector connected to the first voltage source, and an emitter which is coupled commonly to the emitter of the first bipolar transistor;
    an output terminal connected commonly to the emitter of the first bipolar transistor and the emitter of the second bipolar transistor for providing an output signal;
    biasing means connected to the base of the first bipolar transistor and to the base of the second bipolar transistor for biasing the first and second bipolar transistors;
    control means having an input terminal connected to the base of the first bipolar transistor for producing a control signal in response to the amplitude modulated signal supplied to the input terminal; and
    variable current source means having a first end connected to the emitters of the first and second bipolar transistors, and a second end connected to a second voltage source providing a second power voltage which is different from the first power voltage, for causing to flow therethrough a drive current to the second voltage source, said drive current being a sum of an emitter current flowed through the first bipolar transistor and an emitter current flowed through the second bipolar transistor, said variable current source means having an input terminal connected to the control means for receiving therefrom the control signal and controlling the drive current flowing therethrough in response to the control signal;
    said control means controlling the variable current source by the control signal such that the output signal at the output terminal has a voltage level which increases linearly with increasing amplitude of the input amplitude modulated signal in one of positive and negative half cycles of the amplitude modulated signal and such that the output signal has a constant voltage level in the other of the positive and negative half cycles of the amplitude modulated signal.

2. A detection circuit as claimed in claim 1 in which said control means produces a control current as the control signal such that the control current has a magnitude that changes with the amplitude of the amplitude modulated signal at the input terminal in a predetermined range of amplitude of the amplitude modulated signal and such that the control current remains constant irrespective of the amplitude of the amplitude modulated signal in a range of the amplitude beyond the predetermined range, and said variable current source means provides the drive current by subtracting the control current from the predetermined current.

3. A detection circuit as claimed in claim 2 in which said control means changes the control current generally linearly with the amplitude of the amplitude modulated signal in the predetermined range in both the positive and negative half cycles of the amplitude modulated signal at the input terminal.

4. A detection circuit as claimed in claim 2 in which said first bipolar transistor includes a p-n junction between the base and the emitter, said p-n junction providing a curved rectifying characteristic for the amplitude modulated signals that have an amplitude smaller than a predetermined input voltage range, and said predetermined range is determined to correspond to said input voltage range.

5. A detection circuit as claimed in claim 2 in which said control means comprises a differential circuit having a first input terminal connected to the base of the first bipolar transistor and a second end connected to the base of the second bipolar transistor for detecting a voltage difference between the first and second input terminals, said control means producing the control signal in response to the detected voltage difference.

6. A detection circuit as claimed in claim 2 in which said control means comprises:
    a first resistance provided between the collector of the first bipolar transistor and the first voltage source;
    a second resistance provided between the collector of the second bipolar transistor and the first voltage source;
    a third bipolar transistor having a base connected commonly with the base of the first bipolar transistor to the input terminal, an emitter, and a collector connected to the first voltage source;
    a fourth bipolar transistor having a base connected commonly with the base of the second bipolar transistor to the biasing means, an emitter connected commonly with the emitter of the third bipolar transistor, a collector connected to the first voltage source via second level shifting means;

first constant current source means having a first end connected to the second voltage source and a second end connected to the emitters of the third bipolar transistor and the fourth bipolar transistor;

a fifth bipolar transistor having a base connected to the collector of the first bipolar transistor, an emitter, and a collector;

a sixth bipolar transistor having a base connected to the collector of the second bipolar transistor, an emitter connected to the emitter of the fifth bipolar transistor, and a collector;

a second constant current source having a first end connected to the first voltage source and a second end connected to the emitters of the fifth and sixth bipolar transistors;

a seventh bipolar transistor having a base connected to the second end of the first level shifting means, an emitter connected to the collector of the fifth bipolar transistor, and a collector;

an eighth bipolar transistor having a base connected to the collector of the fourth bipolar transistor, an emitter connected commonly with the emitter of the seventh bipolar transistor, to the collector of the fifth bipolar transistor, and a collector;

a ninth bipolar transistor having a base connected commonly with the base of the eights bipolar transistor to the collector of the fourth bipolar transistor, an emitter connected to the collector of the sixth bipolar transistor, and a collector connected commonly with the collector of the seventh bipolar transistor;

a tenth bipolar transistor having a base connected commonly with the base of the seventh bipolar transistor to the collector of the third bipolar transistor, an emitter connected commonly with the emitter of the ninth bipolar transistor to the collector of the sixth bipolar transistor, and a collector that is connected commonly with the collector of the eighth bipolar transistor;

a third constant current source having a first end connected to the first voltage source and a second end;

an eleventh bipolar transistor having a connector connected to the second end of the third current source, an emitter connected to the second voltage source, and a base connected to the collector of the eleventh bipolar transistor;

a twelfth bipolar transistor having a base connected to the base of the eleventh bipolar transistor, a collector connected to the emitter of the first bipolar transistor, and an emitter connected to the second voltage source;

a thirteenth bipolar transistor having a collector connected to the collectors of the eighths and tenth bipolar transistors and further connected to the second end of the third constant current source, a base, and an emitter connected to the second voltage source; and a fourteenth bipolar transistor having a collector connected to the collectors of the seventh and ninth bipolar transistors, a base connected to the base of the thirteenth bipolar transistor and to the collector of the fourteenth bipolar transistor, and an emitter connected to the second voltage source.

7. A detection circuit as claimed in claim 6 in which said third, fourth, eleventh, twelfth, thirteenth and fourteenth bipolar transistors comprise an npn type bipolar transistor, and said fifth, sixth, seventh, eighth, ninth and tenth bipolar transistors comprise a pnp type bipolar transistor.

8. A detection circuit as claimed in claim 1 in which said control means comprises a digital processing unit.

* * * * *

UNITED STATES PATENT AND TRADEMARK OFFICE
CERTIFICATE OF CORRECTION

PATENT NO. : 5,126,683

DATED : June 30, 1992

INVENTOR(S) : Katsuya ISHIKAWA et al.

It is certified that error appears in the above-identified patent and that said Letters Patent is hereby corrected as shown below:

Col. 1, line 23, delete "25".

Col. 2, line 55, after "while" insert --it--.

Col. 6, line 40, change "volta" to --voltage--.

Col. 9, line 28, change "eights" to --eighth--.

Col. 10, line 18, change "eighths" to --eighth--.

Signed and Sealed this

Eighth Day of March, 1994

Attest:

BRUCE LEHMAN

Attesting Officer

Commissioner of Patents and Trademarks